United States Patent [19] [11] 3,766,495
Yamashita et al. [45] Oct. 16, 1973

[54] SEMICONDUCTOR PULSE OSCILLATING DEVICE

[75] Inventors: Sadahiko Yamashita; Toshi Anbe; Yoshihiro Hosokawa; Tomoyasu Nakano, all of Kadoma, Japan

[73] Assignee: Matsushita Electric Industrial Company, Limited, Osaka, Japan

[22] Filed: July 2, 1971

[21] Appl. No.: 159,347

[30] Foreign Application Priority Data

Jan. 22, 1971 Japan .................................. 46/2058

[52] U.S. Cl. .......... 331/101, 317/234 V, 317/235 K, 317/235 AC, 317/235 AD, 331/107 R

[51] Int. Cl. ............................ H03b 7/14, H03k 3/31

[58] Field of Search ......................... 331/107 R, 101; 317/234 V, 235 K, 235 AC, 235 AD

[56] References Cited

UNITED STATES PATENTS

| | | | |
|---|---|---|---|
| 3,466,512 | 9/1969 | Seidel | 317/235 K |
| 3,493,821 | 2/1970 | Bittmann et al. | 331/107 R X |
| 3,593,195 | 7/1971 | Shanks | 331/107 R |

*Primary Examiner*—Roy Lake
*Assistant Examiner*—Siegfried H. Grimm
*Attorney*—John Lezdey et al.

[57] ABSTRACT

A semiconductor pulse oscillating device consisting of three layers of $n$—$\nu$—$n^+$which are GaAs crystal, iron impurity doped in the GaAs and germanium-gold alloy formed on the iron impurity respectively, and two electrodes sandwich the layers. When a bias voltage is applied to the device in the direction of $n$—$\nu$—$n^+$-layers, pulses are generated. The oscillation frequency is in the order of kHz and the pulse width is in the order of from $10^{-7}$ to $10^{-10}$ seconds. This device is used in an oscillator circuit and the bias voltage is applied, in conjunction with a coaxial delay line or a capacitor, to the $n$ layer. The output terminal of the circuit is connected to the $n^+$layer of the device.

4 Claims, 9 Drawing Figures

INVENTOR
SADAHIKO YAMASHITA, TOSHI ANBE,
YOSHIHIRO HOSOKAWA & TOMOYASU NAKANO
BY John Lezdey ATTORNEY INVENTOR
SADAHIKO YAMASHITA, TOSHI ANBE,
YOSHIHIRO HOSOKAWA & TOMOYASU NAKANO
BY John Lezdey
ATTORNEY INVENTOR
SADAHIKO YAMASHITA, TOSHI ANBE
YOSHIHIRO HOSOKAWA & TOMOYASU NAKANO
BY John Lezdey ATTORNEY

SEMICONDUCTOR PULSE OSCILLATING DEVICE

This invention relates to a semiconductor oscillator and more particularly to a GaAs oscillating device.

The specific purpose of this invention is to provide a novel GaAs oscillator having an $n^+-\nu-n$ structure.

The carrier concentration of the $n$-layer is of from $10^{15}$ to $10^{16}cm^{-3}$, and that of the $\nu$-layer is about one-tenth as high as the $n$-layer. The $\nu$-layer is composed of $n$-type GaAs and doped with iron impurity, which provides deep acceptor levels in the energy band structure of this $\nu$-layer. These layers constitute an $n^+-\nu-n$ structure which has a break-shaped barrier in its energy band structure thereby to readily pass therethrough current in the direction from $n^+-$ to $n$-layers but does not pass appreciable current in the opposite direction. Therefore, the former and the latter directions are respectively regarded as forward and reverse directions in this specification.

In the drawings:

FIG. 3(*b*) is an oscillator circuit of another embodiment according to the invention;

FIG. 3(*c*) is an oscillator circuit of another modified embodiment according to the present invention;

FIG. 4(*b*) is a diagram showing a waveform of voltage across the pulse oscillator in the oscillating circuit shown in FIG. 3(*a*);

Figure 1:
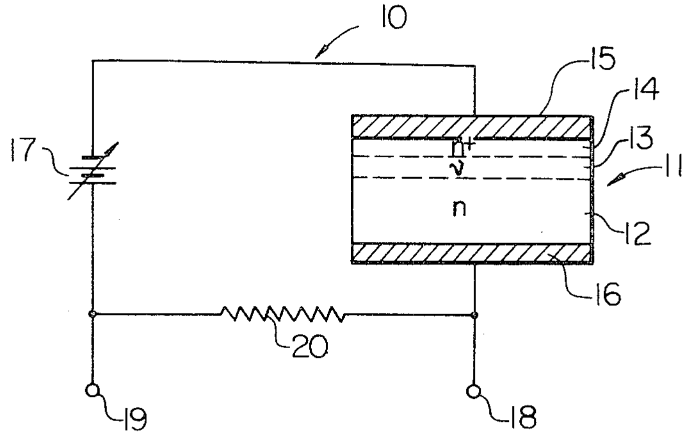
FIG. 1 is a schematic diagram of a pulse oscillator of this invention.

FIG. 1 illustrates a pulse oscillator 10 according to this invention, which comprises a semiconductor body 11 having an $n$-layer 12 composed of $n$-GaAs having a carrier concentration of from $10^{15}$ to $10^{16}$ per cubic centimeter. A $\nu$-layer 13 is formed on the $n$-layer 12 by doping iron impurity. The doped iron impurity provides acceptor levels within the forbidden gap of the energy band structure of the GaAs crystal. The acceptor levels are so deep that the acceptor levels are filled with electrons, or majority carriers from the conduction band with the result that the carrier concentration of the $\nu$-layer is reduced to one-tenth as high as that of the $n$-layer. On the $\nu$-layer is formed an $n^+$-layer which is composed of a material selected from the group consisting of germanium-gold alloy, indium and tin. To both the $n$- and $n^+$-layers are ohmically contacted electrodes 15 and 16 which are respectively connected to a negative terminal of a d.c. electrical power source 17 and to a terminal 18. The oscillating device thus constructed is connected to a source 17 through a resistor 20. When the bias voltage is sufficiently high, the oscillator oscillates by itself with the result that repetition pulse train is obtained through the terminals 18 and 19.

Figure 2:
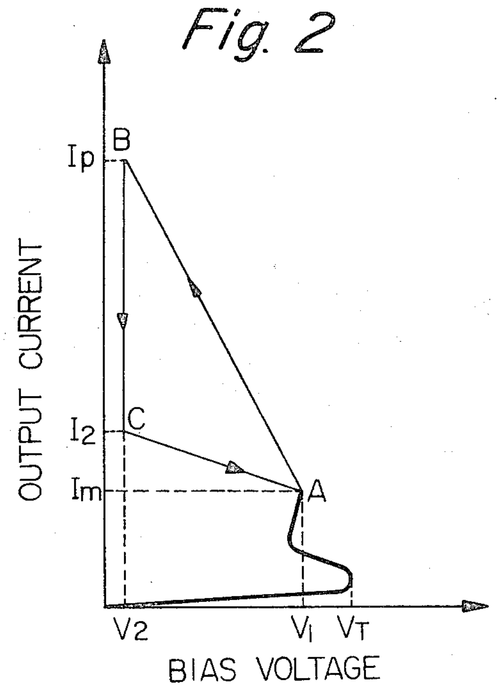
FIG. 2 is a diagram showing the voltage-current characteristics of the pulse oscillator shown in FIG. 1.

Referring to FIG. 2, the operation of the pulse oscillator 10 is explained in detail.

When the bias voltage applied to the oscillator from the source 17 is small, a certain number of carrier electrons in the conduction band of the $\nu$-layer are trapped at the acceptor levels so that the carrier concentration of the $\nu$-layer is apparently one-tenth of the $n$-layer as described hereinbefore.

As the bias voltage is increased, the electrons trapped at the acceptor levels are released and return to the conduction band. In this instance, the acceptor levels become recombination-generation centers so that the carrier concentration of the $\nu$-layer increases whereby a space-charge limited current flows through the oscillating device which current is proportional to a square value of the bias voltage.

When the bias voltage exceeds the threshold voltage $V_T$, an avalanche break down takes place in the $\nu$-layer, which results in generating a great number of electron hole pairs. The holes of the thus generated electron-hole pairs are trapped at the acceptor levels so that the distribution of the recombination centers is distorted. As a result the conductivity of the $\nu$-layer is reduced, and the state of the semiconductor device reaches to state (A) where the current through the semiconductor body is equal to a critical current $I_m$ and the voltage across the semiconductor body is equal to a voltage $V_1$. In this instance, most of the acceptor levels are filled with the holes so that the barrier height in the $\nu$-layer is reduced whereby the avalanche break down is promoted so that the state of the oscillating device reaches a state (B) wherein the current therethrough is equal to a peak current $I_p$ and the voltage thereacross is near to a voltage $V_2$. The voltage $V_2$ is so small that the avalanche break down is supressed with the result that the state of the semiconductor body reaches a state (C) wherein the current is equal to a current $I_2$ and the voltage is equal to the voltage $V_2$. On the other hand, the holes trapped at the acceptor levels are emitted and therefore the state of the semiconductor body returns to the initial state (A). As far as the bias voltage applied to the semiconductor body is maintained above the voltage $V_1$, the cycle A-B-C is repeated, which results in generation of a continuous pulse oscillation.

It is now apparent that the repetition rate of the oscillation is defined by the duration from trapping to emission of the holes at the acceptor levels.

In this instance, it should be noted that a ratio of the threshold voltage $V_T$ to the critical voltage $V_1$ is proportional to a ratio of $\delta_p/\delta_n$, where $\delta_p$ and $\delta_n$ respectively represent capture cross sections for holes and electrons of the acceptor levels.

Another $\nu$-layer may be provided in the substrate of the oscillating device 11 so as to make the device operative under a bias voltage in either reverse or forward direction. The thickness of the $\nu$-layer is less than 20 $\mu$m and preferably lower than 10 $\mu$m.

Figures 3A, 3B, 3C, 4A, 4B:
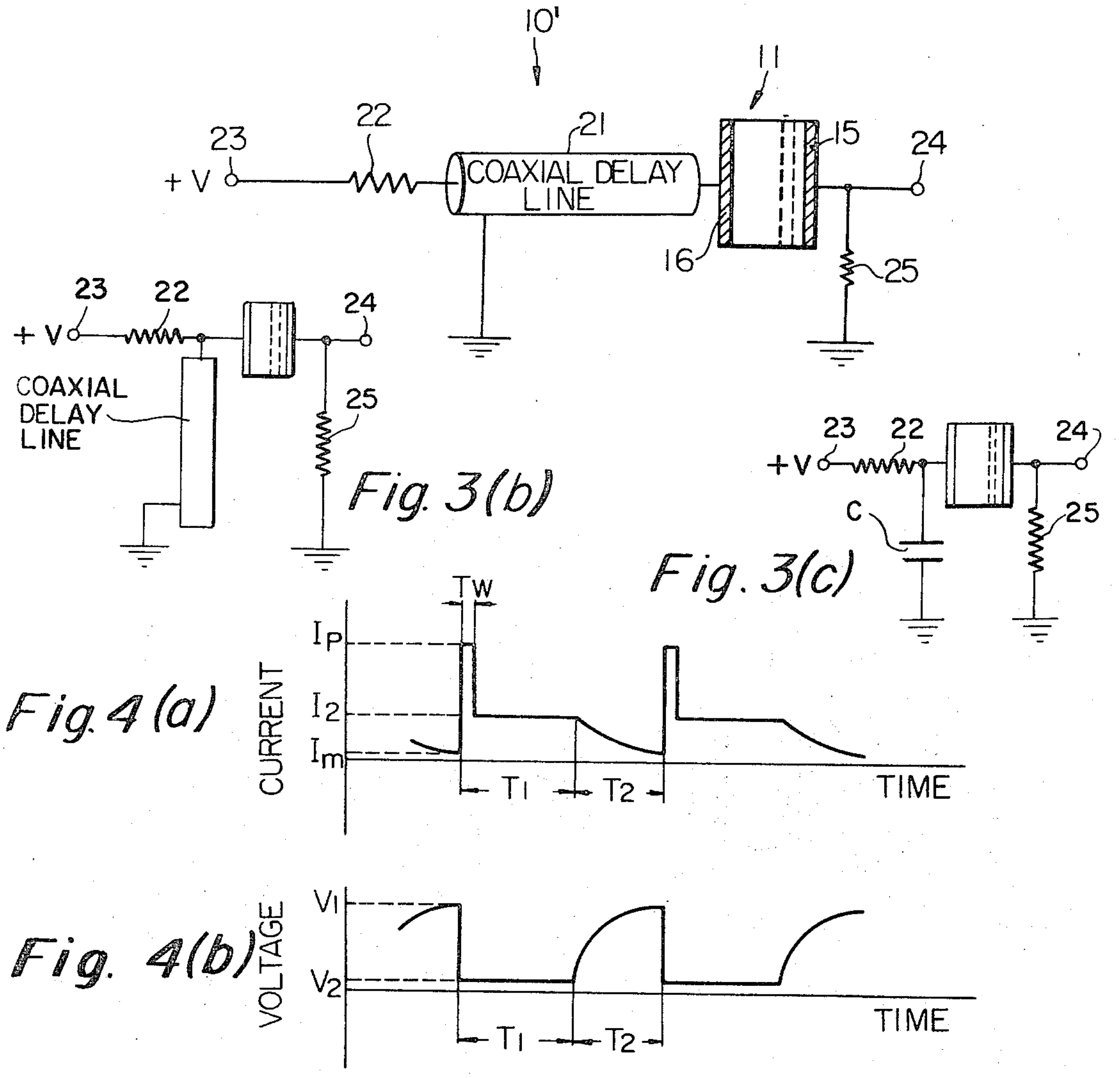
FIG. 3(*a*) is an oscillating circuit diagram including the pulse oscillator shown in FIG. 1.
FIG. 4(*a*) is a diagram showing a waveform of current flowing through the oscillator in the oscillating circuit shown in FIG. 3(*a*)

FIG. 3(*a*) illustrates an oscillating circuit 10' according to this invention which includes the oscillating device 11 of FIG. 1. The electrode 16 is connected to one end of an inner conductor of a coaxial delay line 21 having an outer conductor grounded. The other end of the inner conductor is connected to a series resistor 22 which is in turn connected to an input terminal. A d.c. voltage is impressed on the input terminal 23 so as to apply a suitable bias voltage to the oscillating device 11. The electrode 15 of the semiconductor body 11 is connected to an output terminal 24 and to the ground through a load resistor 25 preferably having the same impedance as the delay line 21.

Another oscillating circuit using the device is shown in FIG. 3(*b*). In this circuit arrangement the coaxial delay line is connected in parallel with the oscillating device.

In the circuit shown in FIG. 3(*c*) the coaxial delay line as seen in FIG. 3(*b*) is replaced by a capacitor C.

Referring now to FIG. 4 which illustrates the voltage and current characteristics on the pulse oscillating device 11 of the circuit 10' of FIG. 3(*a*) the operation of the circuit is discussed hereinbelow.

When the voltage is raised to the voltage $V_1$, the oscillating device 11 is short-circuited whereby the current therethrough rapidly varies from $I_m$ to $I_p$. This variation is transmitted as a step signal through the delay line 21 to the series resistor 22. Since the series resistor 22 has a large resistance, the transmitted step signal is reflected thereat and then returns to the oscillating device 11 through the delay line 21 so that a pulse is produced having a time width $T_w$ equal to the time period when the step signal is transmitted and returned through the delay line 21.

If preferred, the electrode 16 and the series resistor 22 are directly connected with each other and the delay line 21 is inserted between the electrode 16 and the ground. In this case the delay line 21 may be replaced by a suitable capacitor.

Furthermore, the oscillating device 11 may be triggered by a suitable triggering circuit.

Since the value of the capacitance of the device 11 increases as the size thereof increases, the body 11 should be constructed as small as possible, for instance, 250 $\mu m^2$ in area and 100 $\mu m$ in thickness.

For example, according to this invention with a $\nu$-layer of 10 $\mu m$ thickness and total capacitance 1.5 *p*F, the rise time is 280 pico-seconds.

The pulse duration $T_w$ in FIG. 3(*a*) is expressed as:

$T_w = 2L/v$ where L = length of the delay line $v$ = transmission velocity of electric wave in the delay line The current $I_p$ is expressed as:

$I_p = (V_1 / r) \cdot [r / (Z_o + r)]$ where $Z_o$ = characteristic impedance of the delay line $r$ = resistance of the load resistor If, in this instance, the impedance $Z_o$ and $r$ are respectively equal to 50 Ω and the voltage $V_1$ is equal to about 100V, then the current $I_p$ is equal to about 1 A.

Thereafter the current is lowered to the current $I_2$ during a time duration $T_1$. The voltage is raised to the voltage $V_1$ and concurrently the current is reduced to the current $I_m$ during a time duration $T_2$.

The rise time of the pulse, that is a time period of transition from the current $I_m$ to the current $I_p$, is determined by the following parameters 1), 2) and 3).

1. rise time of the avalanche break down = $1/a \cdot V_s$ where $a$ = multiplication factor of the avalanche break down
   $V_s$ = drift velocity of carriers
2. transit time of carrier = $l/V_s$ where $l$ = the width of the $\nu$-layer
3. dielectric relaxation time $=\epsilon/\iota$ where $\epsilon$= dielectric constant of the $\nu$-layer $\iota$ = conductivity of the $\nu$-layer The parameter 1) is proper to a material used for the substrate. In the case of GaAs, the factor $a$ is in the order of $10^5$ and $V_s$ is in the order of $10^7$ and therefore the parameter 1) is in the order of $10^{-12}$ seconds. As to the parameter 2), the width $l$ is selected to be $10^{-3}$cm in the case of this invention so that the parameter 2) is $10^{-3}$ seconds. The parameter 3) is the order of $10^{-10}$ seconds.

Figure 5:
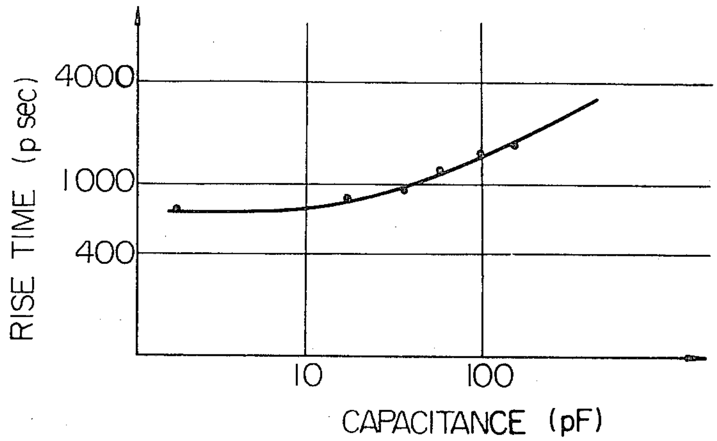
FIG. 5 is an illustrative graphical representation of the rise time of the pulse generated in the oscillator vs. the capacitance of the oscillator shown in FIG. 1.

It should be now apparent that the oscillating circuit has an extremely short rise time. The rise time of the oscillating device is shown in FIG. 5 in terms of the capacitance of the diode.

Figure 6:
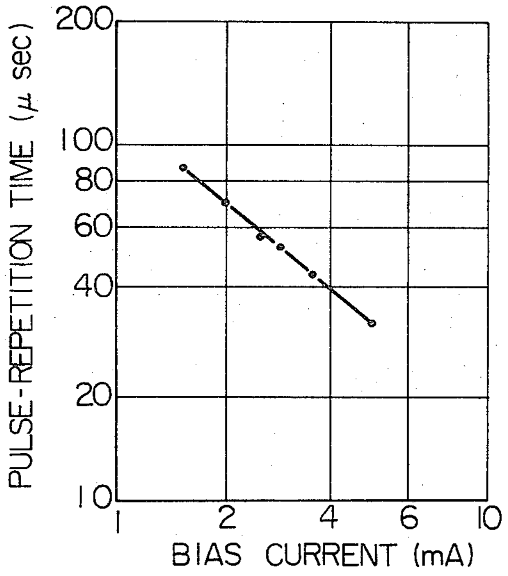
FIG. 6 is an illustrative graphical representation of the pulse-repetition rate vs. the bias current through the pulse oscillator shown in FIG. 1.

FIG. 6 illustrates pulse repetition time of the output pulse oscillation of the device in terms of the bias current. It is seen that the time period of the output pulse is shortened as the bias current is reduced.

The following Examples are presented to further illustrate the detailed aspects of this invention. It is appreciated that the invention is not any way limited by the description of the examples. It is to be noted that the carrier concentration of the *n*-layer depends on the thickness of impurity layer ($\nu$-layer) and formation of thickness of the iron impurity is effected by the diffusion temperature.

EXAMPLE 1

An *n*-GaAs crystal having a thickness of 80 $\mu m$ and a carrier concentration of $5 \times 10^{15}$ per cubic centimeter at rooom temperature was prepared. On the abovementioned *n*-GaAs crystal epitaxially grown a $\nu$-layer which is composed of *n*-GaAs crystal and being doped with iron impurity. The $\nu$-layer has a thickness of 10 $\mu m$ and a carrier concentration of $5 \times 10^{14}$ per $cm^3$ at room temperature. After etching and cleaning the surface of the thus obtained $\nu$-layer, an eutectic mixture of gold and germanium was deposited by vacuum evaporation on the cleaned surface. The *n*-layer, $\nu$-layer, and $n^+$-layer are sandwiched by two electrodes. A d.c. power source of 100V was connected to the electrodes through a load resistor of 50Ω and a series resistor of 20 *k*Ω. Then, the pulse oscillation took place which had the following properties:

threshold current . . . . . 4mA
frequency . . . . . . 25KHz
amplitude . . . . . 10V
rise time . . . . . 300Ps
pulse width . . . . . 500Ps

EXAMPLE 2

An *n*-GaAs crystal having a thickness of 90 $\mu m$ and a carrier concentration of $5 \times 10^{15}$ per cubic centimeter at room temperature was prepared. On the *n*-GaAs crystal was epitaxially grown a $\nu$-layer which is composed of *n*-GaAs crystal and being doped with iron impurity. The $\nu$-layer had a thickness of 10 $\mu m$ and a carrier concentration of $7 \times 10^{14}$. After etching and cleaning the surface of the thus obtained $\nu$-layer, tin was deposited by vacuum evaporation on the cleaned surface. The *n*-layer, $\nu$-layer and $n^+$-layer are sandwiched by two electrodes with one electrode ohmically contacting the *n*-layer and the other electrode ohmically contacting the $n^+$-layer. A d.c. power source of 100V was connected to the electrodes through a load resistor of 50 Ω and a series resistor 20 *k*Ω. Then, the pulse oscillation had the following properties:

threshold current . . . . . 3mA
frequency . . . . . 15 KHz
amplitude . . . . . 40V
rise time . . . . . 500 ps pulse width . . . . . 1 ns

What is claimed is:

1. A pulse oscillating device comprising an $n$-layer of GaAs crystal having a carrier concentration of from $10^{15}$ to $10^{16}$ per cubic centimeter, a $\nu$-layer of iron impurity doped in said GaAs crystal and having a carrier concentration of $10^{14}$ to $10^{15}$ per $cm^3$, an $n^+$-layer of germanium-gold alloy formed on said $\nu$-layer, and a pair of electrodes sandwiching said layers therebetween, one of said pair of electrodes contacting said $n^+$-layer and the other contacting said $n$-layer.

2. A pulse oscillating circuit comprising an energy source, an oscillating device according to claim 1, a load resistor, one end of which being connected to the one of said pair of electrodes of said device and the other end being connected to ground, a coaxial delay line having inner and outer conductors, one end of the inner conductor being connected to the other of said pair of electrodes of said device and the other end of said inner conductor being connected to the energy source through a serires resistor, and the outer conductor of said line being connected to ground, whereby pulses are generated from said oscillating device in accordance with energy from said energy source.

3. A pulse oscillating circuit as claimed in claim 2, wherein the time period of the generated pulse is controlled by a bias current.

4. A pulse oscillating circuit comprising an energy source, an oscillating device according to claim 1, a load resistor, one end of which is connected to the one of said pair of electrodes of said device and the other end connected to ground, a series resistor connected between the energy source and the other of said pair of electrodes, a coaxial delay line having inner and outer conductors, said delay line being connected in parallel to the oscillating device and the load resistor with the inner conductor being connected between one end of the series resistor and the other of said electrodes of said oscillating device and with the outer conductor being connected to the ground.

* * * * *